(12) United States Patent
Chen et al.

(10) Patent No.: US 11,419,243 B2
(45) Date of Patent: Aug. 16, 2022

(54) RACK FOR IMMERSION COOLING

(71) Applicant: Quanta Computer Inc., Taoyuan (TW)

(72) Inventors: Chao-Jung Chen, Taoyuan (TW);
Yu-Nien Huang, Taoyuan (TW);
Herman Tan, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 82 days.

(21) Appl. No.: 17/165,597

(22) Filed: Feb. 2, 2021

(65) Prior Publication Data
US 2022/0110222 A1    Apr. 7, 2022

Related U.S. Application Data

(60) Provisional application No. 63/086,359, filed on Oct. 1, 2020.

(51) Int. Cl.
*H05K 7/20*    (2006.01)

(52) U.S. Cl.
CPC ..... *H05K 7/20272* (2013.01); *H05K 7/20236* (2013.01); *H05K 7/20772* (2013.01); *H05K 7/20781* (2013.01)

(58) Field of Classification Search
CPC ........... H05K 7/20272; H05K 7/20236; H05K 7/20781; H05K 7/20763–20781; G06F 2200/201; G06F 1/20
See application file for complete search history.

(56) References Cited

U.S. PATENT DOCUMENTS

| 10,390,458 B2 | 8/2019 | Tufty et al. |
| 10,609,839 B1 * | 3/2020 | Archer ................. F28D 1/0206 |
| 10,638,641 B2 | 4/2020 | Franz et al. |
| 2009/0260777 A1 * | 10/2009 | Attlesey ............... H01L 23/473 |
| | | 165/104.33 |

(Continued)

FOREIGN PATENT DOCUMENTS

| CN | 111434197 A | 7/2020 |
| TW | 201633881 A | 9/2016 |

OTHER PUBLICATIONS

Extended European Search Report for EP Application No. 21171849.9, dated Oct. 28, 2021.

(Continued)

*Primary Examiner* — Stephen S Sul
(74) *Attorney, Agent, or Firm* — Nixon Peabody LLP

(57) ABSTRACT

A system having a rack, an input manifold, an output manifold, and a drain manifold is installed. The rack is configured to support a computing device. The input manifold, the output manifold, and the drain manifold are each configured to be fluidly coupled to the housing. When the computing device is in a first position relative to the rack, the input manifold and the output manifold are fluidly coupled to the housing and the drain manifold is disconnected from the housing. When the computing device is in a second position relative to the rack, the input manifold and the output manifold are disconnected from the housing and the drain manifold is fluidly coupled to the housing. When the computing device is in a third position relative to the rack, the input manifold, the output manifold, and the drain manifold are disconnected from the housing.

20 Claims, 11 Drawing Sheets

(56) References Cited

U.S. PATENT DOCUMENTS

| | | | |
|---|---|---|---|
| 2010/0290190 A1* | 11/2010 | Chester | B65B 63/08 174/547 |
| 2011/0026225 A1* | 2/2011 | Ostwald | H05K 7/20645 165/104.31 |
| 2013/0312854 A1* | 11/2013 | Eriksen | F28F 19/00 137/544 |
| 2014/0076518 A1* | 3/2014 | Edwards | F28D 1/0475 165/71 |
| 2014/0198452 A1 | 7/2014 | Brunschwiler et al. | |
| 2016/0029510 A1* | 1/2016 | Cader | H05K 7/20 165/80.2 |
| 2016/0242318 A1* | 8/2016 | Krug, Jr. | H05K 7/20772 |
| 2017/0325358 A1* | 11/2017 | Franz | H05K 7/20781 |
| 2018/0131128 A1* | 5/2018 | Franz | H01R 13/5219 |
| 2019/0090383 A1* | 3/2019 | Tufty | H05K 7/20263 |
| 2020/0305307 A1* | 9/2020 | Amos | H01L 23/4735 |

OTHER PUBLICATIONS

TW Office Action for Application No. 110114400, dated May 5, 2022, w/ First Office Action Summary.

TW Search Report for Application No. 110114400, dated May 5, 2022, w/ First Office Action.

* cited by examiner

RACK FOR IMMERSION COOLING

CROSS-REFERENCE TO RELATED APPLICATIONS

This application claims priority under 35 U.S.C. § 119 to U.S. Provisional Application No. 63/086,359, entitled "Immersion Cooling Design" and filed on Oct. 1, 2020. The contents of that application are hereby incorporated by reference herein in their entirety.

TECHNICAL FIELD

The present disclosure relates generally to systems and devices for cooling computing devices that are mounted within a rack. More particularly, aspects of this disclosure relate to a rack that allows for computing devices to be mounted at an angle for immersion cooling.

BACKGROUND

Many computing systems (such as servers) utilize immersion cooling designs in order to keep electronic components cool during operation. Immersion cooling involves submerging electronic components in a liquid that is thermally conductive but not electrically conductive. These designs often utilize large cooling tanks into which individual computing devices can be inserted. The tanks can be filled with the liquid to cool the computing devices. However, to service the individual computing devices, the computing devices must be removed from the cooling tank, and the liquid must be allowed to drain off the computing device (e.g., via gravity) before the computing device can be serviced. Moreover, a robotic arm must often be used to remove the computing devices from the cooling tank. The existing systems therefore require a large expenditure of resources and time to service. Thus, new systems and devices for cooling computing devices are needed.

SUMMARY

In a first implementation, the present disclosure is directed toward a liquid cooling system for cooling a computing device. The liquid cooling system comprises a rack, an input manifold, an output manifold, and a drain manifold. The rack is configured to support a computing device that is installed in the rack. The computing device includes a housing having one or more electronic components disposed therein. The input manifold, the output manifold, and the drain manifold are each configured to be fluidly coupled to the housing. When the computing device is in a first position relative to the rack, the input manifold and the output manifold are fluidly coupled to the housing. and the drain manifold is disconnected from the housing. When the computing device is in a second position relative to the rack, the input manifold and the output manifold are disconnected from the housing and the drain manifold is fluidly coupled to the housing.

In some cases, the liquid cooling system further comprises a cooling distribution unit that is fluidly coupled to the input manifold, the output manifold, and the drain manifold. The cooling distribution unit is configured to cause cooling liquid to flow from the input manifold to the output manifold through the housing of the computing device.

In some cases, when the computing device is in the first position, the cooling liquid can flow into the housing through the input manifold, and out of the housing through the output manifold. When the computing device is in the second position, the cooling liquid can flow out of the housing through the drain manifold. When the computing device is in a third position relative to the rack, the input manifold, the output manifold, and the drain manifold are all disconnected from the housing, such that the housing prevents the cooling liquid from flowing into out of the computing device.

In some cases, the cooling distribution unit includes a pump, a reserve tank, and a heat exchanger. The pump is fluidly coupled to input manifold. The reserve tank is fluidly coupled to output manifold and the drain manifold. The heat exchanger is fluidly coupled to the pump, the reserve tank, and an external cold liquid source that is configured to remove heat from the cooling liquid. When the computing device is in the first position, the pump is configured to cause the cooling liquid to flow through the input manifold, the housing, the output manifold, and the heat exchanger. When the computing device is in the second position, the cooling liquid is configured to flow from the housing to the heat exchanger through the drain manifold.

In some cases, the computing device is positioned at an angle when installed in the rack, such that a first end of the housing is positioned lower than an opposing second end of the housing. In some cases, the output manifold is fluidly coupled to the first end of the housing and the input manifold is fluidly coupled to the second end of the housing, such that gravity causes cooling liquid to flow from the second end of the housing to the first end of the housing. In some cases, the drain manifold is fluidly coupled to the first end of the housing. In some cases, the computing device includes an input connector disposed outside of the first end of the housing, and an internal pipe disposed within the housing that is fluidly coupled to the input connector. A first end of the internal pipe is positioned adjacent to the first end of the housing. A second end of the internal pipe is positioned adjacent to the second end of the housing.

In some cases, wherein the input manifold is physically coupled to the input connector of the housing, such that the cooling liquid can flow from the input manifold into the internal pipe. In some cases, the second end of the internal pipe extends across a full width of the second end of the housing, and includes a plurality of apertures configured to emit the cooling liquid. In some cases, the housing includes a fluid collection tray configured to prevent fluid from leaking from the second end of the housing.

In some cases, the computing device includes a drain connector configured to fluidly couple the drain manifold to an interior of the housing. The drain connector includes a body defining a fluid channel, a ball valve positioned in the fluid channel, and a pinion gear coupled to the ball valve. The pinion gear is rotatable to move the ball valve between a flow position and a sealed position. A portion of the body is configured to be inserted into the drain manifold. In some cases, the drain manifold includes a rack gear configured to engage the pinion gear of the drain connector. In some cases, when computing device is moved to the first position, the body of the drain connector moves toward the drain manifold, such that the rack gear rotates the pinion gear to move the ball valve to the sealed position. When the ball valve is in the sealed position, cooling liquid is unable to flow from the housing to the drain manifold through the fluid channel of the drain connector. In some cases, when the computing device is moved from the first position to the second position, the body of the drain connector moves away from the drain manifold, such that rack gear rotates the pinion gear to move the ball valve to the flow position. When the ball valve is in the flow position, the cooling liquid is able to flow from the housing to the drain manifold through the fluid channel of the drain connector.

In some cases, the computing device includes a control mechanism positioned inside the housing. The control mechanism is configured to control a level of cooling liquid within the housing.

In a second implementation, the present disclosure is directed toward a computing device configured to be installed in a rack. The computing device comprises a housing; one or more electronic components disposed in the housing; an input connector positioned at a first end of the housing; an output connector positioned at the first end of the housing; and a drain connector positioned at the first end of the housing. When the computing device is in a first position relative to the rack, the input manifold and the output manifold are configured to be fluidly coupled to the housing and the drain manifold is configured to be disconnected from the housing. When the computing device is in a second position relative to the rack, the input manifold and the output manifold are disconnected from the housing and the drain manifold is fluidly coupled to the housing.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

Figure 1:
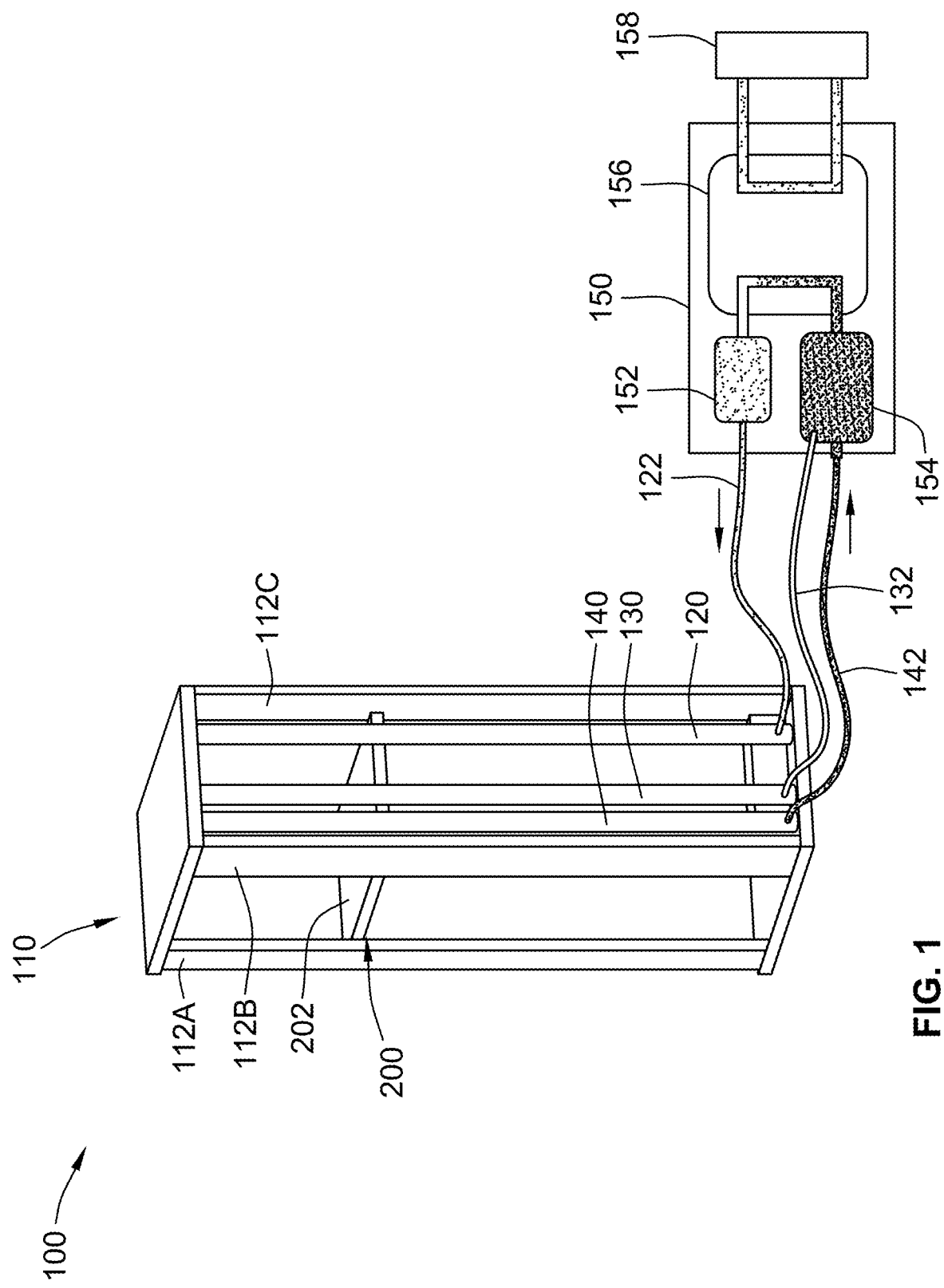
FIG. 1 is a perspective view of a liquid cooling system including a rack, an input manifold, an output manifold, a drain manifold, and a cooling distribution unit, according to aspects of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

FIG. 1 illustrates a liquid cooling system 100 that can be used to cool a variety of different computing devices. The liquid cooling system 100 includes a rack 110, an input manifold 120, an output manifold 130, a drain manifold 140, and a cooling distribution unit 150. The rack 110 is configured to support one or more computing devices that are installed in the rack 110. FIG. 1 shows a single computing device 200 inserted into the rack 110. The rack 110 can include a variety of different structures or mechanisms configured to secure the computing device 200 within the rack 110. For example, in the illustrated implementation, the rack 110 includes legs 112A, 112B, 112C, and a fourth leg that is not visible in FIG. 1. These legs can form slots into which components such as the computing device 200 are inserted. Other manners of securing the computing device 200 in the rack 110 can also be used.

The computing device 200 generally includes one or more electronic components that generate heat during operation. The input manifold 120, the output manifold 130, and the drain manifold 140 are used to circulate a cooling fluid through a housing 202 of the computing device 200, in order to cool the electronic components during operation. In some implementations, the electronic components are fully immersed in the cooling liquid in order to remove heat. In other implementations, the electronic components may not be fully immersed in the cooling liquid, but still come into contact with the cooling liquid to remove heat.

The cooling distribution unit 150 includes a pump 152, a reserve tank 154, a heat exchanger 156, and an external cold liquid source 158. The pump 152 is fluidly coupled to the input manifold 120 and the reserve tank 154. The reserve tank 154 is fluidly coupled to the output manifold 130 and the heat exchanger 156. The heat exchanger 156 is fluidly coupled to the pump 152, the reserve tank 154, and the external cold liquid source 158. In the illustrated implementation, the input manifold 120 is fluidly coupled to the pump 152 via an input tube 122. The output manifold 130 is fluidly coupled to the reserve tank 154 via an output tube 132. The drain manifold 140 is fluidly coupled to the reserve tank 154 via a drain tube 142. This arrangement allows the cooling distribution unit 150 to be positioned apart from the rack 110 and the manifolds 120, 130, and 140, so long as the tubes 122, 132, and 142 can reach the cooling distribution unit 150. However, in other implementations, the pump 152 can be directly fluidly coupled to the input manifold 120, and the reserve tank 154 can be directly fluidly coupled to the output manifold 130 and the drain manifold 140.

During operation of the liquid cooling system 100, the cooling distribution unit 150 operates to cause the cooling liquid to flow through the computing device 200. The pump 152 can pump the cooling liquid from the heat exchanger 156 to the housing 202 of the computing device 200 through the input manifold 120. The pump 152 can also pump the cooling liquid from the housing 202 of the computing device 200 to the reserve tank 154, through the output manifold 130.

The cooling liquid is heated by the electronic components of the computing device 200 when the cooling liquid passes through the housing 202 of the computing device 200. As the pump 152 continues to pump cooling liquid through the input manifold 120, the heated cooling liquid returning from the computing device 200 moves from the reserve tank 154 to the heat exchanger 156. Cold liquid from the external cold liquid source 158 (e.g., cold water) can be continually pumped through the heat exchanger 156. As the cold liquid passes through the heat exchanger 156, the cold liquid removes heat from the heated cooling liquid. The heated cooling liquid is thus cooled back down, and can be pumped from the heat exchanger 156 back to the computing device 200 through the input manifold 120.

Figure 2:
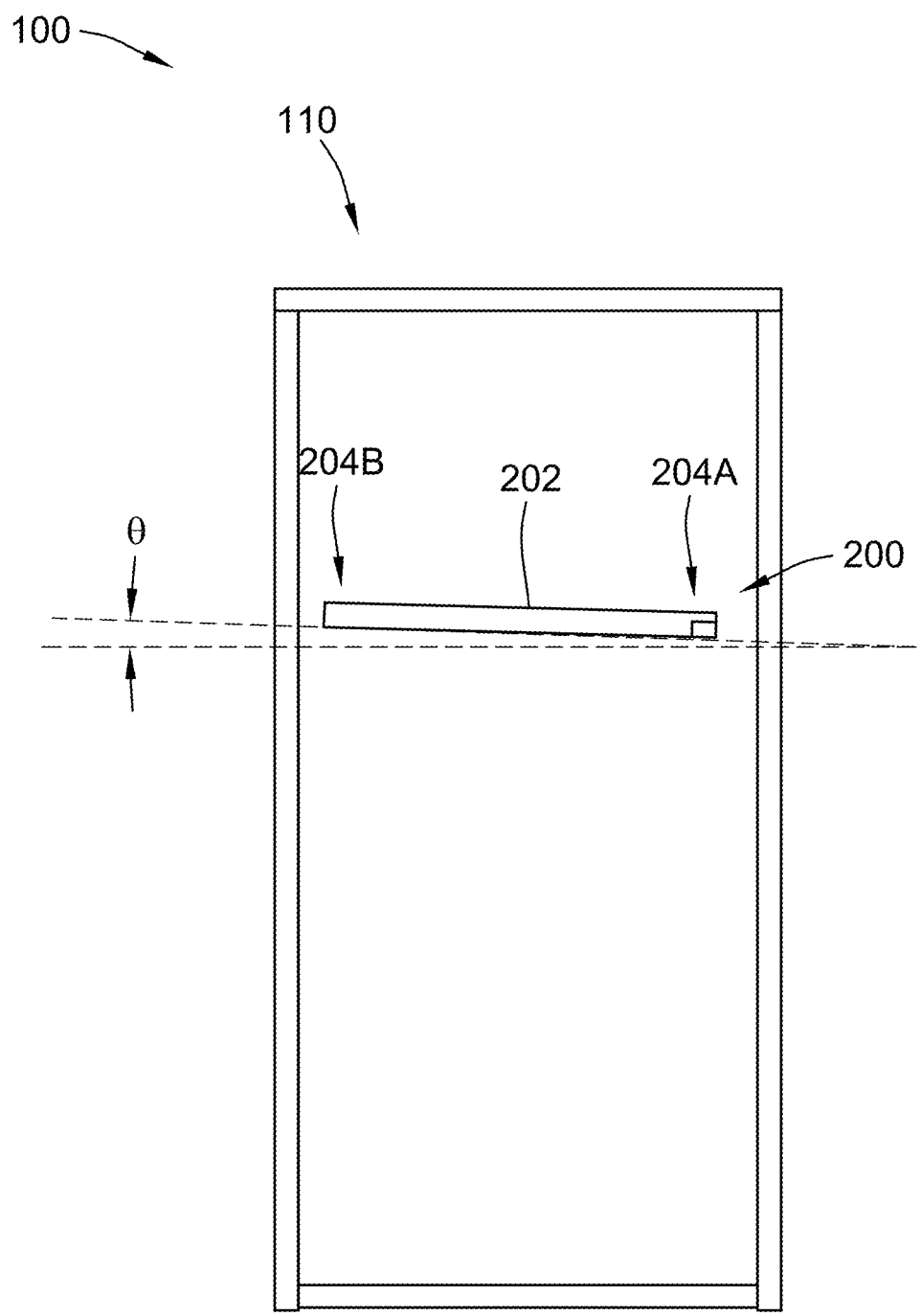
FIG. 2 is a side view of a computing device installed in the rack of FIG. 1, according to aspects of the present disclosure.

FIG. 2 shows a side view of the liquid cooling system 100, when the computing device 200 is installed in the rack 110. When installed in the rack 110, the computing device 200 is disposed at an angle θ relative to the horizontal plane, such that a first end 204A of the housing 202 is positioned lower than a second end 204B of the housing. As discussed in more detail herein, the liquid cooling system 100 can be designed so that the cooling liquid enters the housing 202 at the second end 204B and exits the housing at the first end 204A. By positioning the computing device 200 at the angle θ, gravity can aid in causing the cooling liquid to flow from the second end 204B to the first end 204A.

Figure 3A:
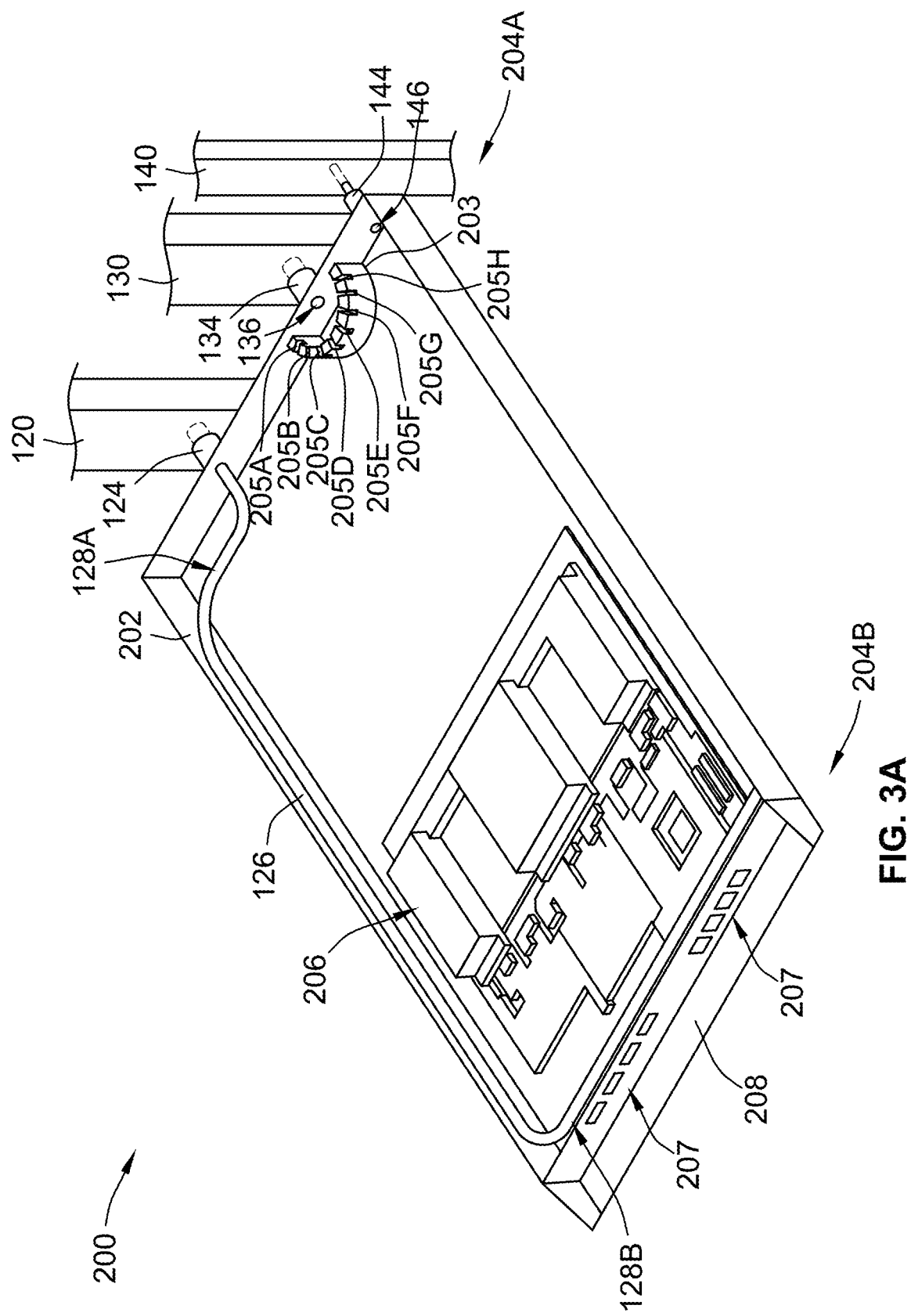
FIG. 3A is a first perspective view of an interior of the computing device of FIG. 2, according to aspects of the present disclosure.

FIG. 3A shows a perspective view of the computing device 200, viewed from the second end 204B of the housing 202. The computing device 200 includes the housing 202, and one or more electronic components 206 positioned within the housing 202. The one or more electronic components 206 can include any combination of components, including processing devices, memory devices, circuit boards, expansion cards, etc. In the illustrated implementation, the electronic components 206 are positioned adjacent to the second end 204B of the housing 202. However, the electronic components 206 can generally be positioned at any suitable location within the housing 202.

The computing device 200 also includes an input connector 124, an output connector 134, and a drain connector 144. The connectors 124, 134, and 144 are positioned on the outside of the housing 202, and can be used to physically and fluidly couple the housing 202 to the cooling distribution unit 150 (FIG. 1). The input connector 124 can be used to physically couple the input manifold 120 to the housing 202. When the computing device 200 is inserted into the rack 110 (FIG. 1), an aperture defined in the input manifold 120 will be aligned with a fluid channel defined through the input connector 124, such that cooling liquid can flow from the input manifold 120 into the input connector 124.

The output connector 134 can be used to physically couple the output manifold 130 to the housing 202. When the computing device 200 is inserted into the rack 110, an aperture defined in the output manifold 130 will be aligned with a fluid channel defined through the output connector 134, such that the cooling liquid can flow from the output connector 134 into the output manifold 130. The drain connector 144 can be used to physically couple the drain manifold 140 to the housing 202. When the computing device 200 is inserted into the rack 110, an aperture defined in the drain manifold 140 will be aligned with a fluid channel defined through the drain connector 144, such that the cooling liquid can flow from the drain connector 144 into the drain manifold 140.

The fluid channel of the output connector 134 is configured to be open to the interior of the housing 202 via an output aperture 136 defined in the first end 204A of the housing 202. The cooling liquid can flow from the housing 202 into the fluid channel of the output connector 134 through output aperture 136. Generally, the output connector 134 is configured such that the fluid channel of the output connector 134 is always open on both ends of the output connector 134 to the output manifold 130 and the housing 202.

Similarly, the fluid channel of the drain connector 144 is configured to be open to the interior of the housing 202 via a drain aperture 146 defined in the first end 204A of the housing 202. The cooling liquid can flow from the housing 202 into the fluid channel of the drain connector 144 through drain aperture 146. As discussed in more detail herein, the drain connector 144 is generally designed so that the fluid channel can be selectively moved between a flow position and a sealed position. When in the flow position, the fluid channel of the drain connector 144 is open on both ends of the drain connector 144 to the drain manifold 140 and the housing. The cooling liquid can only flow from the housing 202 into the drain manifold 140 through the drain connector 144 when the fluid channel of the drain connector 144 is open. Thus, the first end 204A of the housing 202 can be fluidly coupled to both the output manifold 130 and the drain manifold 140.

The computing device 200 includes an internal tube 126. The fluid channel of the input connector 124 is not open to the first end 204A of the housing 202, but is instead fluidly coupled to the internal tube 126. A first section 128A of the internal tube 126 is positioned at the first end 204A of the housing 202. The input connector 124 is configured to be open to the first section 128A of the internal tube 126 through an input aperture (not shown) defined in the first end 204A of the housing 202. The input aperture is generally the same as or similar to the output aperture 136 and the drain aperture 146. Thus, the cooling liquid can flow from the fluid channel of the input connector 124 into the housing 202 through the input aperture. Generally, the input connector 124 is configured such that the fluid channel of the input connector 124 is always open on both ends of the input connector 124. One end of the fluid channel of the input connector 124 is open to the input manifold 120. The other end of the fluid channel of the input connector 124 is open to the first section 128A of the internal tube 126.

A second section 128B of the internal tube 126 is positioned at the second end 204B of the housing 202, so that the internal tube 126 extends between the first end 204A of the housing 202 and the second end 204B of the housing 202. As shown in FIG. 3A, the second section 128B of the internal tube 126 extends across the entire width of the second end 204B of the housing 202. The cooling liquid is configured to flow from the input manifold 120 to the internal tube 126 through the input connector 124. The cooling liquid can then flow through the internal tube 126 and exit the second section 128B of the internal tube 126, at the second end 204B of the housing 202. In this manner, the input manifold 120 is physically coupled to the input connector 124 and the first end 204A of the housing 202, but is fluidly coupled to the second end 204B of the housing 202.

When the computing device 200 is initially connected to the cooling distribution unit 150, the cooling liquid exits the second section 128B of the internal tube 126 and begins to fill the housing 202. The cooling liquid generally fills the housing 202 until the electronic components 206 are partially or fully immersed in the cooling liquid. As the cooling distribution unit 150 continues to pump the cooling liquid into the housing 202 via the input manifold 120 and the internal tube 126, the cooling liquid circulates within the housing 202, and eventually escapes the housing 202 through the output aperture 136 and the output connector 134.

To control the rate at which the cooling liquid escapes the housing through the output connector 134, the computing device 200 includes a control mechanism 203 positioned adjacent to the output aperture 136. In the illustrated implementation, the control mechanism 203 is a half-circle shaped structure that encircles the output aperture 136. The control mechanism 203 includes a number of flow channels 205A-205H. As the cooling liquid circulates within the housing 202, the cooling liquid flows through the flow channels 205A-205H to the output aperture 136. The size and shape of the flow channels 205A-205H affect the rate at which the cooling liquid flows through the flow channels 205A-205H and exits the housing 202, and also the level of the cooling liquid within the housing 202. By adjusting the size and shape of the flow channels 205A-205H, a desired exit flow rate from the housing 202 and a desired cooling liquid level within the housing 202 can be achieved. The number of flow channels in the control mechanism 203 can also be adjusted to aid in achieving the desired exit flow rate and cooling liquid level.

In some implementations, the size of the flow channels 205A-205H can be adjusted based on the alignment with the flow of the cooling fluid from the second end 204B of the housing 202 to the first end 204A of the housing 202. The cooling fluid will generally be able to flow more easily into flow channels that are aligned with the direction of the fluid flow, and thus these flow channels can have a smaller size than the rest of the flow channels, to reduce the flow speed of the fluid through these aligned flow channels. Correspondingly, the cooling fluid will generally be able to flow less easily into flow channels that are not aligned with the direction of the fluid flow, and thus these flow channels can have a larger size than the rest of the flow channels, so as to maintain the same flow speed as the aligned flow channels. The size of the rest of the flow channels can gradually increase from the aligned flow channels to the non-aligned flow channels. Thus, in the illustrated implementation, flow channels 205D and 205E can have a smaller size than the rest of the flow channels, flow channels 205A and 205H can have a larger size than the rest of the flow channels, flow channels 205C and 205B can increase in size from flow channel 205D to flow channel 205A, and flow channels 205G and 205H can increase in size from flow channel 205E to flow channel 205H.

Generally, the housing 202 is not liquid-tight, and some of the cooling fluid that exits the second section 128B of the internal tube 126 can inadvertently leak out of the housing 202. For example, a number of air flow openings 207 can be defined in the second end 204B of the housing 202. These air flow openings 207 allow the computing device 200 to experience a degree of ventilation, but can also allow cooling liquid to leak out of the housing 202. Thus, the computing device 200 can also include some type of fluid barrier to prevent any leakage. In the illustrated implementation, the fluid barrier is a fluid collection tray 208. The fluid collection tray 208 is positioned at the second end 204B of the housing 202, and is configured to catch any cooling fluid that may leak out of the second end 204B of the housing 202, for example through the air flow openings 207. In other implementations, various other types of structures can be used as the fluid barrier.

Figure 3B:
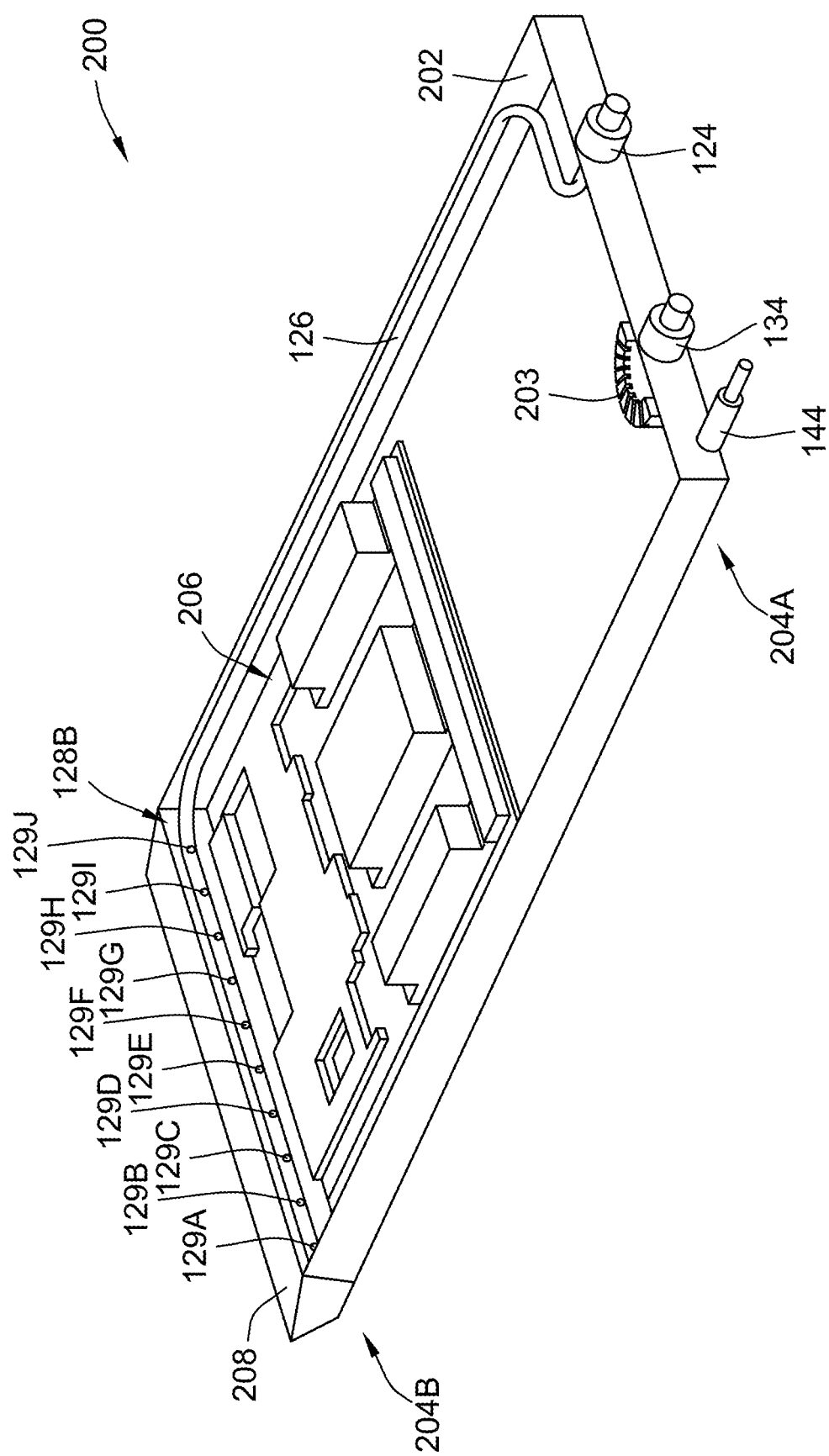
FIG. 3B is a second perspective view of the interior of the computing device of FIG. 2, according to aspects of the present disclosure.

FIG. 3B shows a perspective view of the computing device 200, viewed from the first end 204A of the housing 202. FIG. 3B shows the input connector 124, the internal tube 126, the output connector 134, the drain connector 144, the control mechanism 203, electronic components 206, and the fluid collection tray 208. The internal tube 126 includes a plurality of apertures 129A-129J defined in the second section 128B of the internal tube 126. The apertures 129A-129J are spaced along the entire second section 128B of the internal tube 126, such that the apertures 129A-129J extend along the width of the second end 204B of the housing 202. As the cooling liquid flows through the internal tube 126, the cooling liquid exits the internal tube 126 through the apertures 129A-129J. The cooling liquid is thus spread across the entire width of the second end 204B of the housing 202, which aids in ensuring all of the electronic components 206 will be immersed in the cooling liquid. In the illustrated implementation, the plurality of apertures 129A-129J are evenly spaced along the second section 128B of the internal tube 126. However, in other implementations, the apertures may be located to direct cooling liquid to certain components that may require greater cooling. Further, different sizes and configurations of apertures may be provided.

Figure 4A:
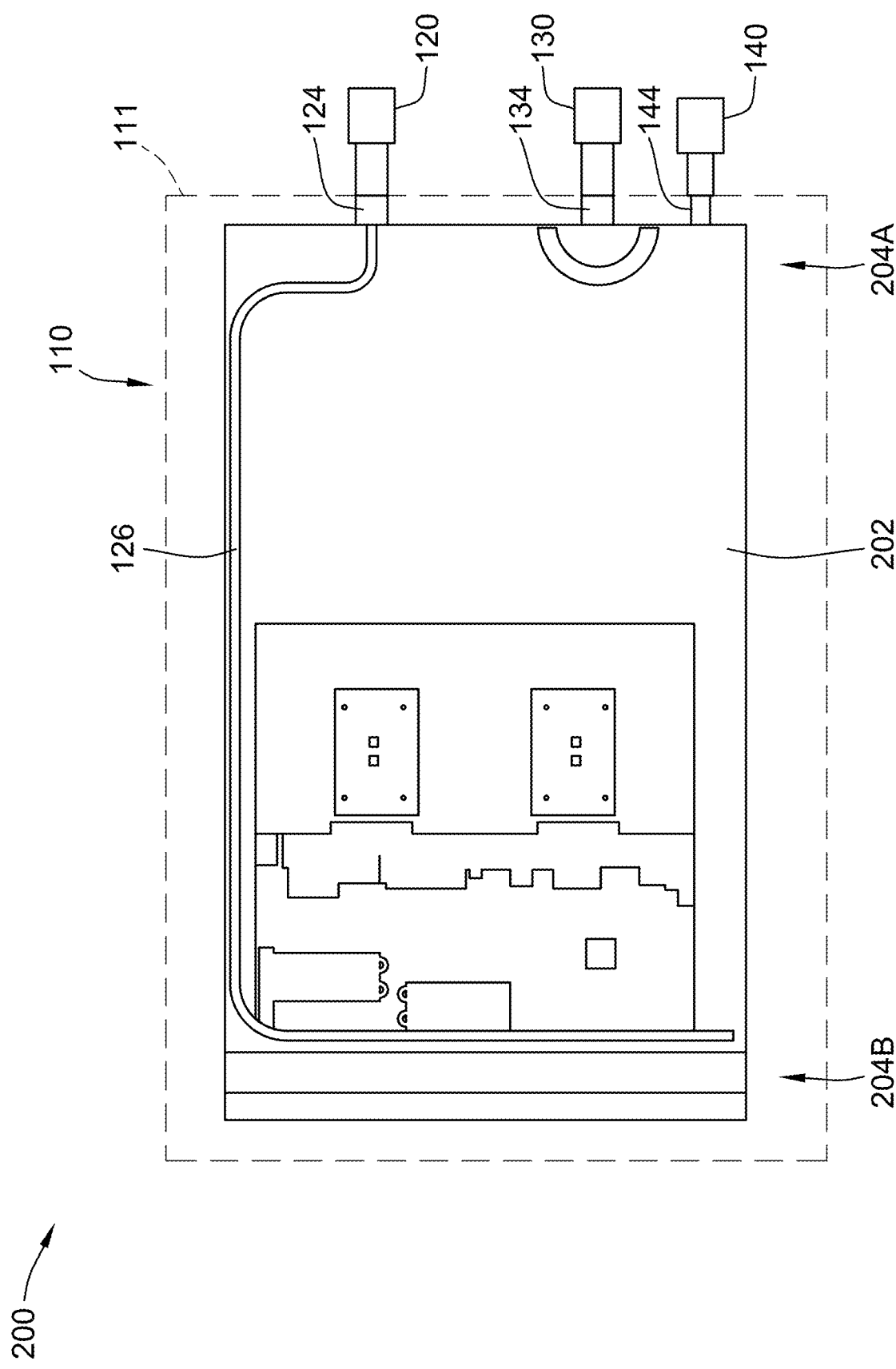
FIG. 4A is a top view of the computing device of FIG. 2 when the computing device is in a first position relative to the rack of FIG. 1, according to aspects of the present disclosure.

FIG. 4A shows the computing device 200 in a first position relative to the rack 110, and the manifolds 120, 130, and 140. When the computing device 200 is in the first position relative to the rack 110, the input connector 124, the output connector 134, and the drain connector 144 are positioned at a back edge 111 of the rack 110, where the manifolds 120, 130, and 140 are located.

When the computing device 200 is in the first position relative to the rack 110, the input connector 124 is physically and fluidly coupled to the input manifold 120, and the output connector 134 is physically and fluidly coupled to the output manifold 130. Generally, a portion of the input connector 124 is inserted into the input manifold 120, while a portion of the output connector 134 is inserted into the output manifold 130. Because the fluid channel of the input connector 124 is open on both ends, the cooling liquid can flow from the input manifold 120, through the input connector 124 and the internal tube 126, and into the computing device 200 at the second end 204B of the housing 202.

Similarly, because the fluid channel of the output connector 134 is open on both ends, the cooling liquid can flow from the first end 204A of the housing 202, through the output connector 134, and into the output manifold 130. Thus, when the cooling distribution unit 150 (FIG. 1) is operating, the pump 152 (FIG. 1) causes the cooling liquid to flow to the housing 202 through the input manifold 120, the input connector 124, and the internal tube 126. The cooling liquid further flows from the housing 202 to the reserve tank 154 (FIG. 1), through the output connector 134 and the output manifold 130.

As shown in FIG. 4A, the drain connector 144 is physically coupled to the drain manifold 140 when the computing device 200 is in the first position. However, the fluid channel of the drain connector 144 is in the sealed position, such that the drain connector 144 is disconnected from the drain manifold when the computing device 200 is in the first position. Thus, when the computing device 200 is in the first position relative to the rack 110, no cooling liquid can flow from the housing 202 into the drain manifold 140 through the drain connector 144.

Figure 4B:
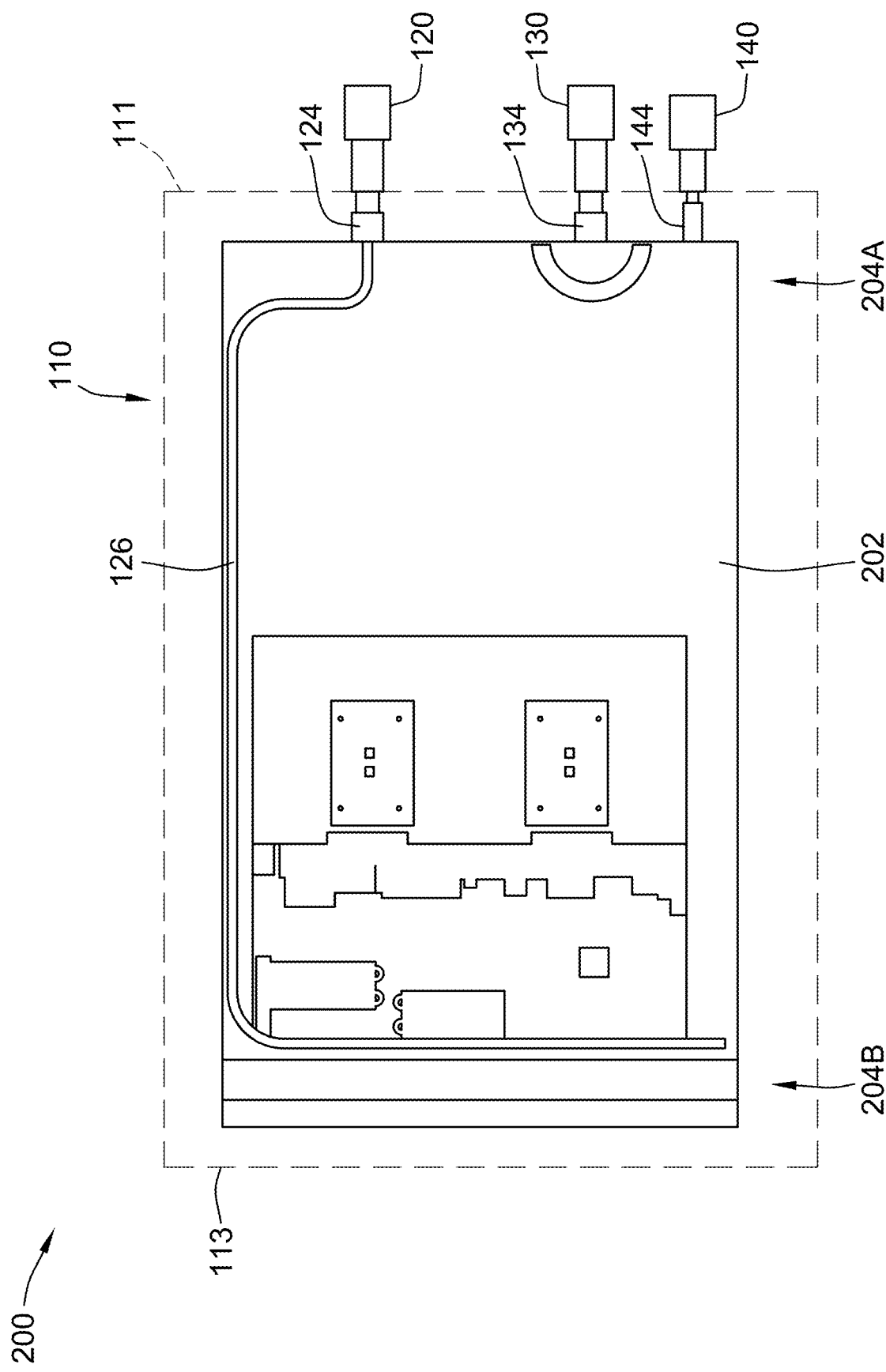
FIG. 4B is a top view of the computing device of FIG. 2 when the computing device is in a second position relative to the rack of FIG. 1, according to aspects of the present disclosure.

FIG. 4B shows the computing device 200 in a second position relative to the rack 110 and the manifolds 120, 130, and 140. In the second position, the computing device 200 is moved away from the back edge 111 of the rack 110, toward a front edge 113 of the rack 110. Generally, a technician can pull the computing device 200 partially out of the rack 110 to move the computing device 200 to the second position. In the illustrated implementation, the second end 204B of the housing 202 is positioned between the back edge 111 and the front edge 113 of the rack 110 when the computing device 200 is in the second position. However, in other implementations, the second end 204B of the housing 202 moves past the front edge 113 of the housing 202 when the computing device 200 is moved to the second position.

When the computing device 200 is in the second position relative to the rack 110, the first end 204A of the housing 202 is spaced apart from the back edge 111 of the rack 110. The input connector 124 is spaced apart from the input manifold 120, and is disconnected from the input manifold 120. Similarly, the output connector 134 is spaced apart from the output manifold 130, and is disconnected from the output manifold 130. Thus, the input manifold 120 and the output manifold 130 are disconnected from the housing 202 when the computing device 200 is in the second position.

The drain manifold 140 is fluidly coupled to the housing 202 when the computing device 200 is in the second position. As shown in FIG. 4B, the drain connector 144 has partially moved away from the drain manifold 140. However, a portion of the drain connector 144 remains inserted into the drain manifold 140. As discussed in more detail herein, moving the drain connector 144 away from the drain manifold 140 as shown in FIG. 4B causes the fluid channel of the drain connector 144 to move to the flow position. In the flow position, the cooling liquid can flow from the housing 202 to the reserve tank 154 of the cooling distribution unit 150 (FIG. 1) through the drain connector 144 and the drain manifold 140.

Figure 4C:
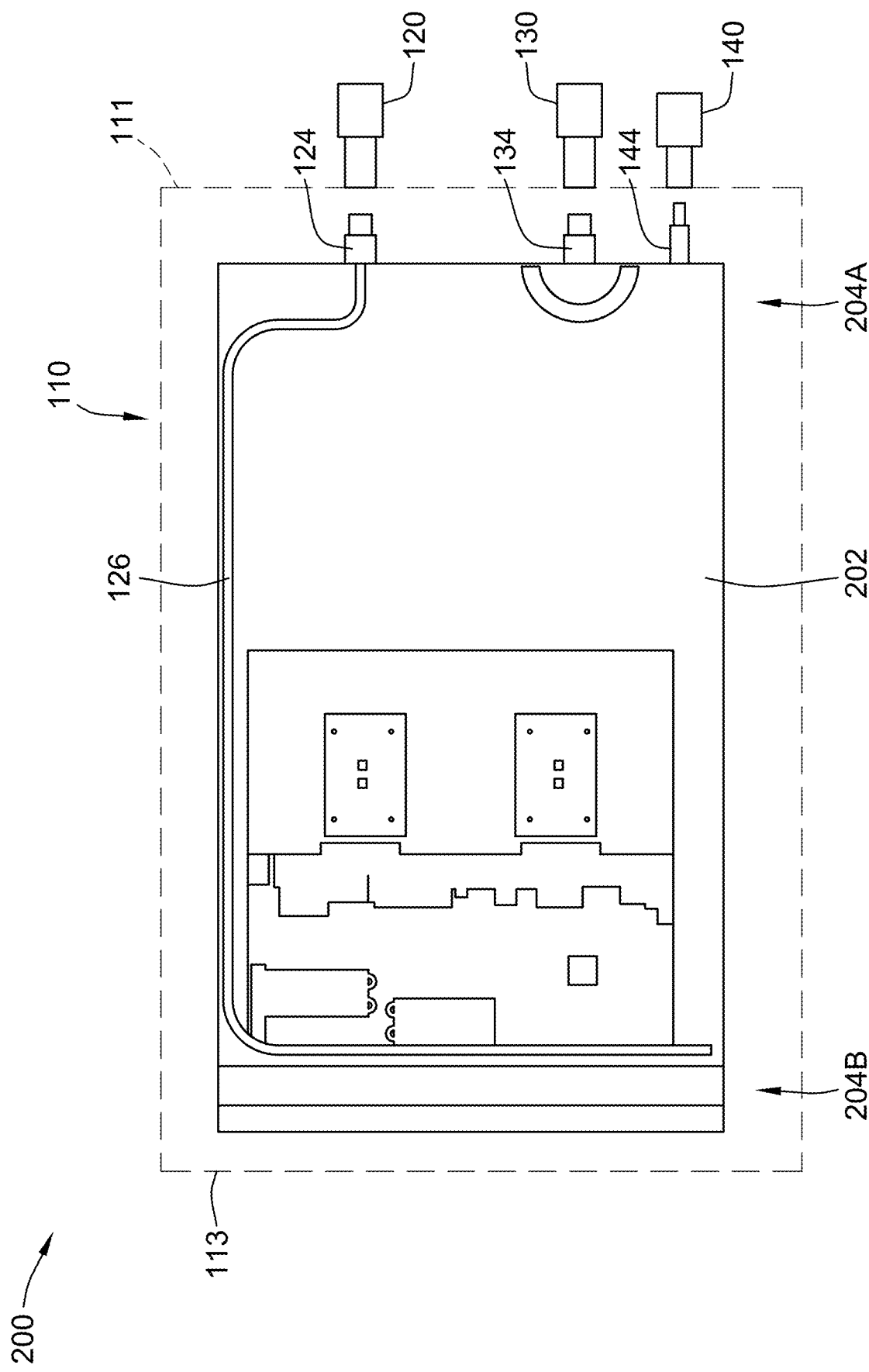
FIG. 4C a top view of the computing device of FIG. 2 when the computing device is in a third position relative to the rack of FIG. 1, according to aspects of the present disclosure.

FIG. 4C shows the computing device 200 in a third position relative to the rack 110 and the manifolds 120, 130, and 140. In the third position, the computing device 200 is moved further away from the back edge 111 of the rack 110, and further toward the front edge 113 of the rack 110. Generally, the technician can continue pulling the computing device 200 out of the rack 110 to move the computing device 200 to the third position. In the illustrated implementation, the second end 204B of the housing 202 is still positioned between the back edge 111 and the front edge 113 of the rack 110 when the computing device 200 is in the third position. However, in other implementations, the second end 204B of the housing 202 moves past the front edge 113 of the housing 202 when the computing device 200 is moved to the third position.

When the computing device 200 is in the third position relative to the rack 110, the first end 204A of the housing 202 is further spaced apart from the back edge 111 of the rack 110. The input connector 124 is spaced apart from the input manifold 120 and is disconnected from the input manifold 120, similar to the second position. The output connector 134 is also spaced apart from the output manifold 130 and is disconnected from the output manifold 130, similar to the second position. However, unlike the second position, the drain connector 144 is spaced apart from the drain manifold 140, and is disconnected from the drain manifold 140. The input manifold 120, the output manifold 130, and the drain manifold 140 are all disconnected the housing 202 when the computing device 200 is in the third position, and no cooling liquid can flow between the cooling distribution unit 150 (FIG. 1) and the housing 202 of the computing device 200.

Figure 5:
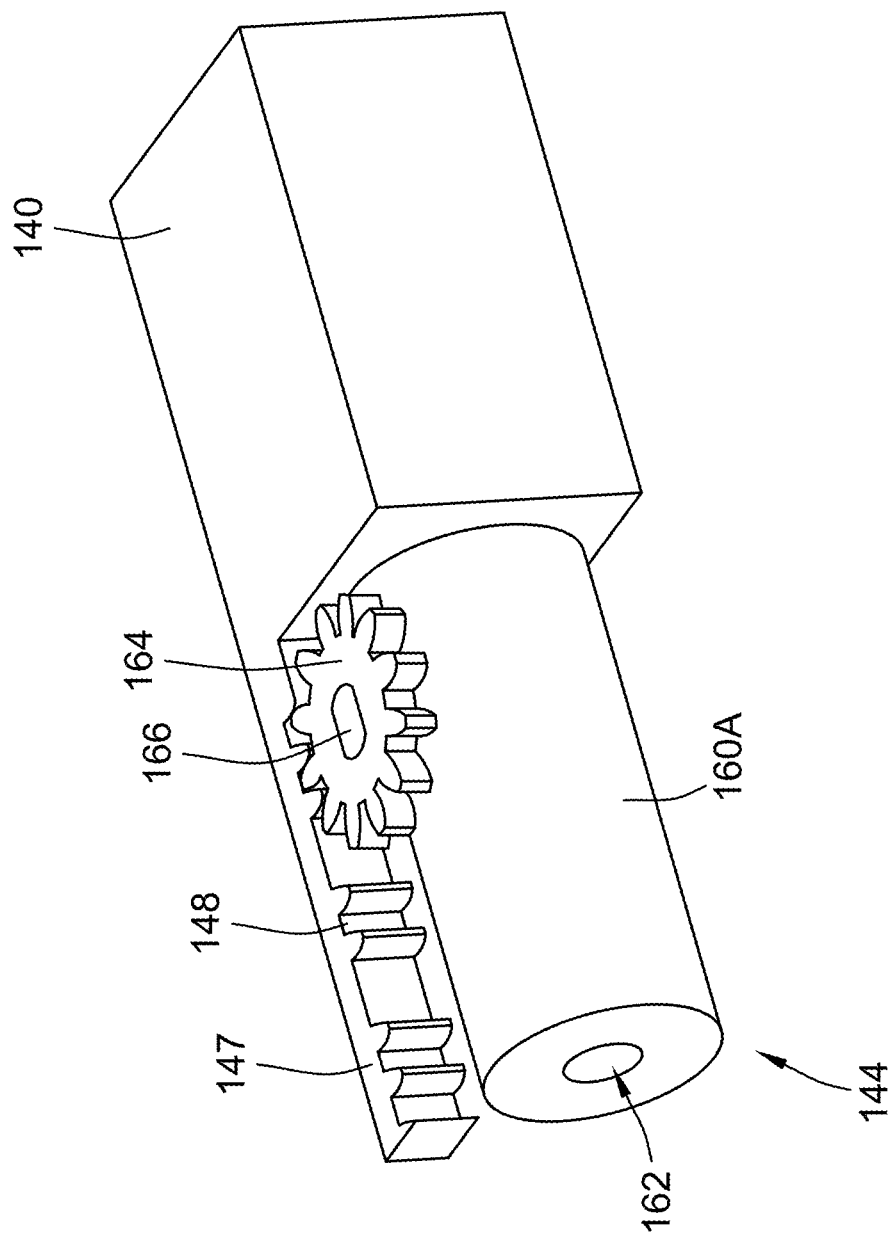
FIG. 5 is a perspective view of a drain connector coupled to the drain manifold of FIG. 1, according to aspects of the present disclosure.
Figure 6A:
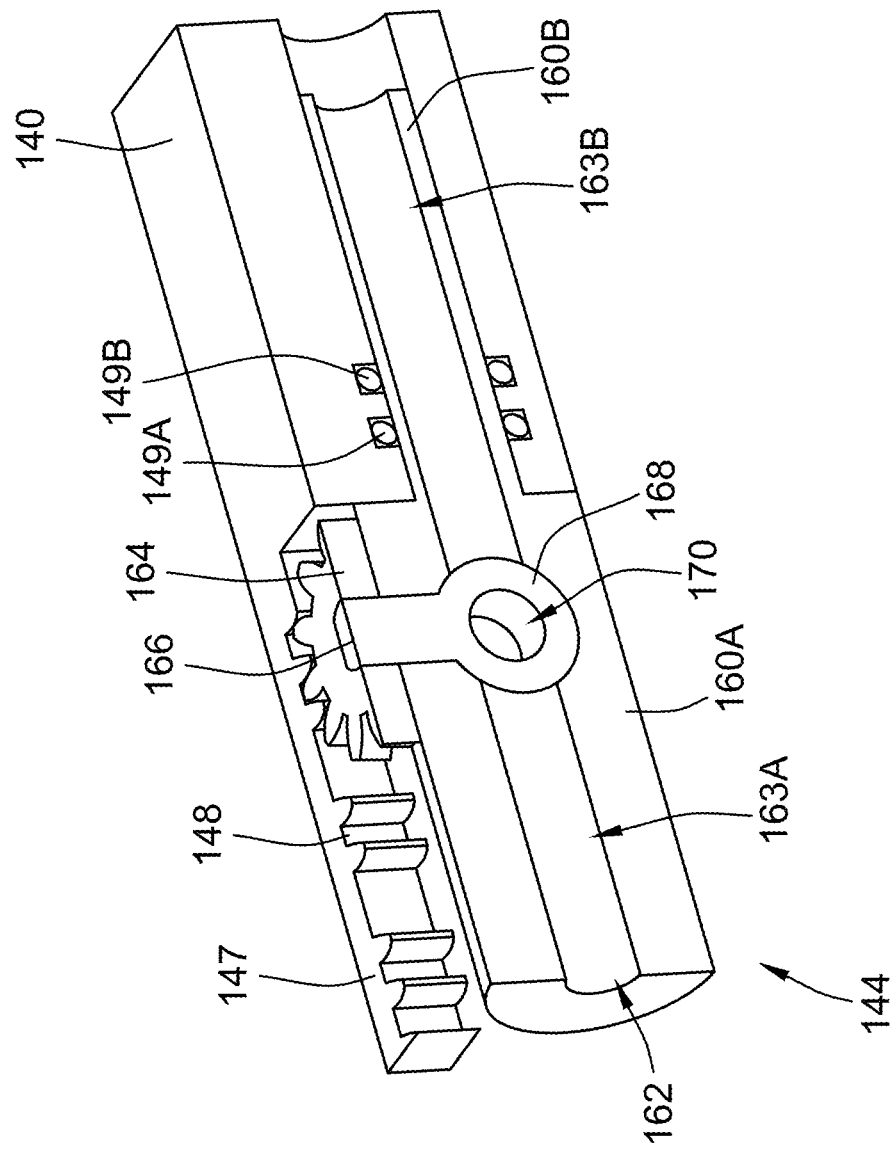
FIG. 6A is a cut-away view of the drain connector of FIG. 5 in a first position relative to the drain manifold of FIG. 1, according to aspects of the present disclosure.

FIG. 5 is a close-up view showing the drain connector 144 and the drain manifold 140, when the computing device 200 is in the first position relative to the rack 110 (FIG. 4A). In the first position, the drain connector 144 is physically coupled to a portion of the drain manifold 140. The drain connector 144 includes a first body portion 160A and a second body portion 160B (FIG. 6A). In FIG. 5, the second body portion 160B is inserted into the drain manifold 140, and thus is not visible. A fluid channel 162 of the drain connector 144 is defined through the first body portion 160A and through the second body portion 160B. The drain connector 144 also includes a pinion gear 164 mounted to the first body portion 160A via a gear shaft 166. The drain manifold 140 includes an arm 147 extending toward the drain connector 144. A rack gear 148 is formed along a side of the arm 147 closest to the drain connector 144. The rack gear 148 is configured to engage the pinion gear 164 of the drain connector 144.

FIG. 6A is a cut-away view of FIG. 5, showing the second body portion 160B of the drain connector 144 inserted into the drain manifold 140. FIG. 6A shows the drain connector 144 and the drain manifold 140 when the computing device 200 is in the first position relative to the rack 110 (FIG. 4A). The drain connector 144 includes a ball valve 168 formed on the lower end of the gear shaft 166. The ball valve 168 has a generally spherical shape, and includes a valve channel 170 extending through the ball valve 168. The ball valve 168 is seated within the fluid channel 162, such that the fluid channel 162 is generally divided into a first portion 163A and a second portion 163B. The drain manifold 140 includes two sealing members, shown in FIG. 6A as O-rings 149A and 149B. The O-rings 149A and 149B form a generally liquid-tight seal between the exterior of the second body portion 160B, and the inside of the drain manifold 140. This liquid-tight seal prevents any of the cooling liquid from leaking out of the connection between the drain connector 144 and the drain manifold 140.

When the computing device 200 is in the first position, the ball valve 168 is in a sealed position, as shown in FIG. 6A. In the sealed position, the valve channel 170 is not aligned with the fluid channel 162, but instead extends generally perpendicularly to the fluid channel 162. The ball valve 168 thus prevents the cooling liquid from flowing through the fluid channel 162 of the drain connector 144, when the computing device 200 is in the first position. The first portion 163A of the fluid channel 162 is fluidly coupled to the interior of the housing 202 (FIG. 1), and the second portion 163B of the fluid channel 162 is fluidly coupled to the interior of the drain manifold 140. However, because the ball valve 168 is in the sealed position, the first portion 163A and the second portion 163B are not fluidly coupled to each other, and the cooling liquid is unable to flow from the housing 202 to the drain manifold 140 through the fluid channel 162 of the drain connector 144.

Figure 6B:
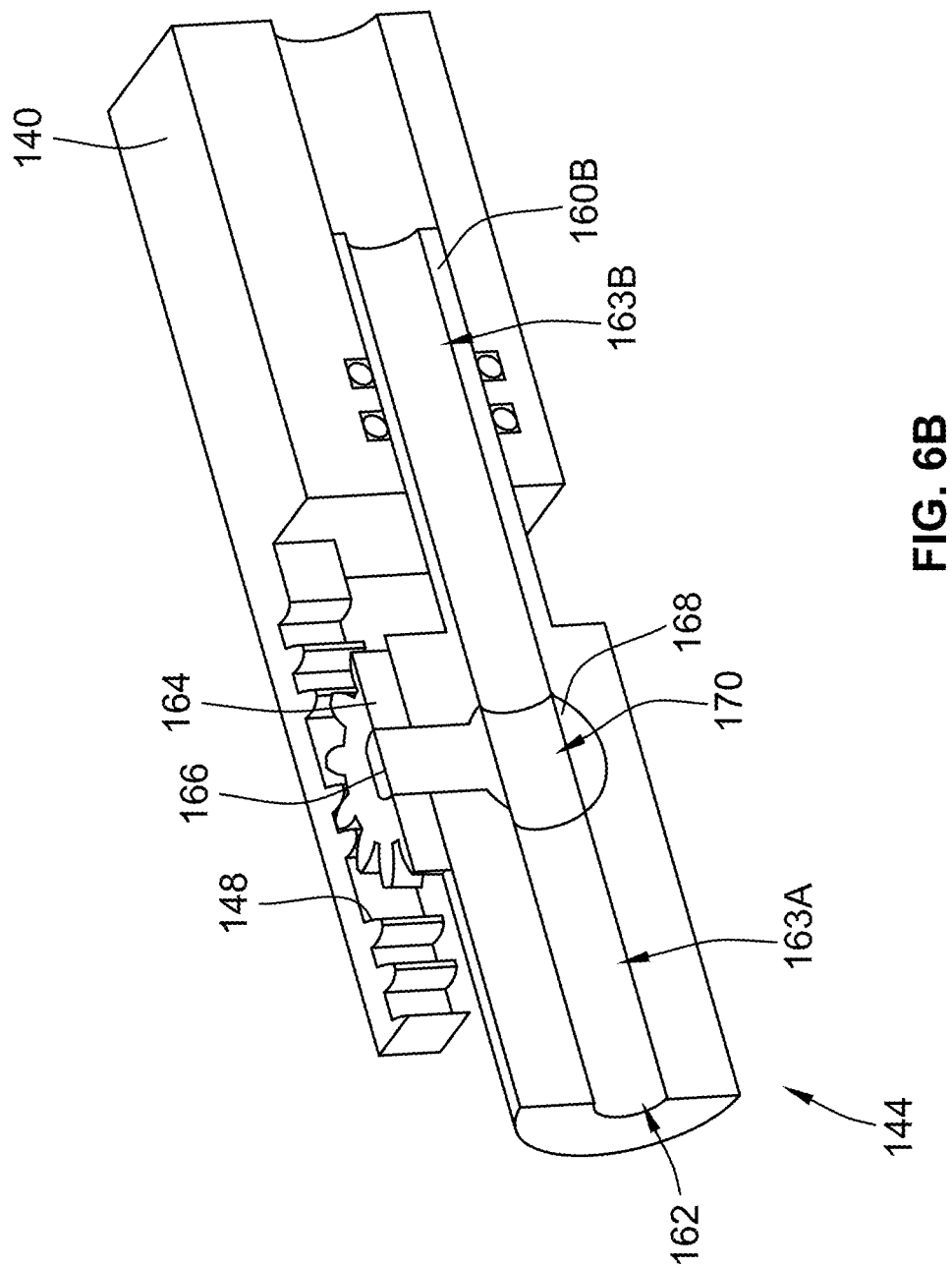
FIG. 6B is a cut-away view of the drain connector of FIG. 5 in a second position relative to the drain manifold of FIG. 1, according to aspects of the present disclosure.

FIG. 6B is a cut-away view of the drain connector 144 and the drain manifold 140 when the computing device 200 is in the second position relative to the rack 110 (FIG. 4B). When the computing device 200 is moved to the second position, the drain connector 144 is moved away from the drain manifold 140. However, the second body portion 160B of the drain connector 144 is still partially positioned within the drain manifold 140. As the drain connector 144 is moved away from the drain manifold 140, the pinion gear 164 moves relative to the rack gear 148. Because the rack gear 148 engages the pinion gear 164, this movement causes the pinion gear 164 to rotate. The rotation of the pinion gear 164 rotates the gear shaft 166 and the ball valve 168, because the gear shaft 166 and the ball valve 168 are coupled to the pinion gear 164.

Moving the computing device 200 to the second position thus rotates the ball valve 168 from the sealed position to the flow position. In the flow position, the valve channel 170 of the ball valve 168 is aligned with the fluid channel 162. The first portion 163A of the fluid channel 162 is fluidly coupled to the second portion 163B of the fluid channel 162, such that the cooling liquid can flow from the housing 202 to the drain manifold 140, through the fluid channel 162. Generally, the cooling distribution unit 150 (FIG. 1) is turned off prior to the computing device 200 being moved to the second position. Thus, when the computing device 200 is in the second position, the cooling liquid is allowed to drain out of the housing 202, through the drain connector 144, and into the drain manifold 140.

Figure 6C:
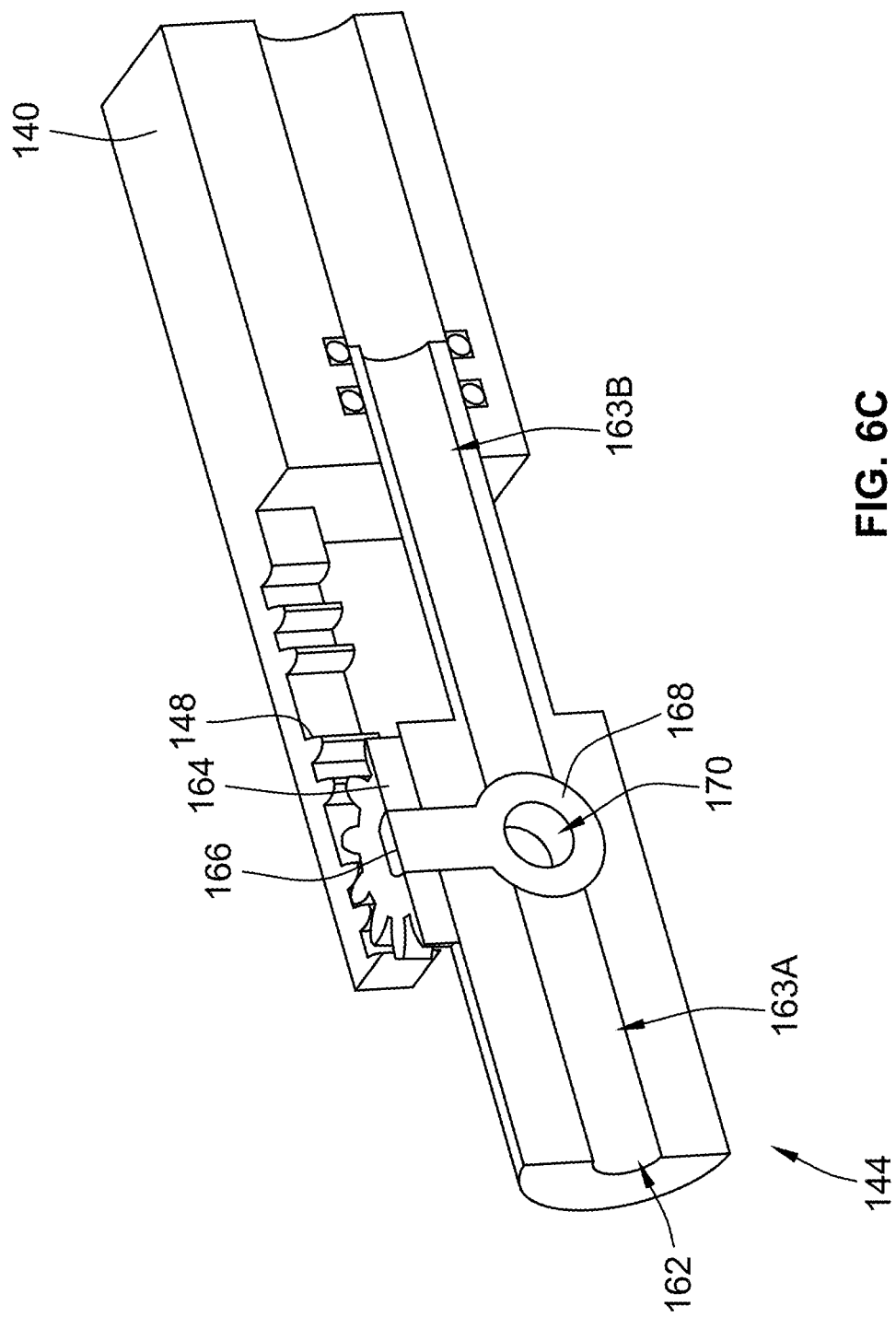
FIG. 6C is a cut-away view of the drain connector of FIG. 5 in a third position relative to the drain manifold of FIG. 1, according to aspects of the present disclosure.

FIG. 6C is a cut-away view of the drain connector 144 and the drain manifold 140 as the computing device 200 is moved from the second position relative to the rack 110 (FIG. 4B) to the third position relative to the rack 110 (FIG. 4C). As the computing device 200 is moved to the third position, the drain connector 144 moves further away from the drain manifold 140. This movement of the drain connector 144 causes the rack gear 148 to further rotate the pinion gear 164 and the gear shaft 166. The rotation of the gear shaft 166 rotates the ball valve 168 back to the sealed position. In the sealed position, the valve channel 170 of the ball valve 168 is no longer aligned with the fluid channel 162 of the drain connector 144. The first portion 163A of the fluid channel 162 is no longer fluidly coupled to the second portion 163B of the fluid channel 162, such that no cooling liquid can flow between the housing 202 and the drain manifold 140 through the fluid channel 162 of the drain connector 144.

In the implementation illustrated herein, only the drain connector 144 includes a ball valve that can be moved between a flow position and a sealed position. However, in other implementations, one or both of the input connector 124 and the output connector 134 (FIGS. 4A-4C) can be formed similar to the drain connector 144 in FIGS. 6A-6C. In these implementations, both the input connector 124 and the output connector 134 can have a ball valve that moves between a flow position and a sealed position as the computing device 200 is removed from the rack 110. However, unlike the ball valve 168 of the drain connector 144, the valves of the input connector 124 and the output connector 134 will be in the flow position when the computing device 200 is in the first position relative to the rack 110. Then, as the computing device 200 is initially pulled out of the rack 110 and moved to the second position, the ball valves of the input connector 124 and the output connector 134 will rotate to the sealed position. Thus, the cooling liquid will be unable to flow through the input connector 124 and the output connector 134 (since the ball valves are in the sealed position), but will be able to flow through the drain connector 144 (since the ball valve is in the flow position).

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A liquid cooling system for cooling a computing device, the liquid cooling system comprising:
a rack configured to support the computing device installed in the rack, the computing device including a housing having one or more electronic components disposed therein;
an input manifold configured to be fluidly coupled to the housing;
an output manifold configured to be fluidly coupled to the housing; and
a drain manifold configured to be fluidly coupled to the housing;
wherein when the computing device is in a first position relative to the rack, the input manifold and the output manifold are fluidly coupled to the housing and the drain manifold is disconnected from the housing, and wherein when the computing device is in a second position relative to the rack, the input manifold and the output manifold are disconnected from the housing and the drain manifold is fluidly coupled to the housing.

2. The liquid cooling system of claim 1, further comprising a cooling distribution unit that is fluidly coupled to the input manifold, the output manifold, and the drain manifold, the cooling distribution unit being configured to cause cooling liquid to flow from the input manifold to the output manifold through the housing of the computing device.

3. The liquid cooling system of claim 2, wherein when the computing device is in the first position, the cooling liquid can flow into the housing through the input manifold, and out of the housing through the output manifold.

4. The liquid cooling system of claim 2, wherein when the computing device is in the second position, the cooling liquid can flow out of the housing through the drain manifold.

5. The liquid cooling system of claim 2, wherein when the computing device is in a third position relative to the rack, the input manifold, the output manifold, and the drain manifold are all disconnected from the housing, such that the housing prevents the cooling liquid from flowing into out of the computing device.

6. The liquid cooling system of claim 2, wherein the cooling distribution unit includes:
a pump fluidly coupled to the to input manifold;
a reserve tank fluidly coupled to the output manifold and the drain manifold; and
a heat exchanger fluidly coupled to the pump, the reserve tank, and an external cold liquid source that is configured to remove heat from the cooling liquid.

7. The liquid cooling system of claim 6,
wherein when the computing device is in the first position, the pump is configured to cause the cooling liquid to flow through the input manifold, the housing, the output manifold, and the heat exchanger; and
wherein when the computing device is in the second position, the cooling liquid is configured to flow from the housing to the heat exchanger through the drain manifold.

8. The liquid cooling system of claim 1, wherein the computing device is positioned at an angle when installed in the rack, such that a first end of the housing is positioned lower than an opposing second end of the housing.

9. The liquid cooling system of claim 8, wherein the output manifold is fluidly coupled to the first end of the housing and the input manifold is fluidly coupled to the opposing second end of the housing, such that gravity causes cooling liquid to flow from the opposing second end of the housing to the first end of the housing.

10. The liquid cooling system of claim 9, wherein the drain manifold is fluidly coupled to the first end of the housing.

11. The liquid cooling system of claim 9, wherein the computing device includes an input connector disposed outside of the first end of the housing, and an internal pipe disposed within the housing that is fluidly coupled to the input connector, a first end of the internal pipe being positioned adjacent to the first end of the housing, a second end of the internal pipe being positioned adjacent to the opposing second end of the housing.

12. The liquid cooling system of claim 11, wherein the input manifold is physically coupled to the input connector of the housing, such that the cooling liquid can flow from the input manifold into the internal pipe.

13. The liquid cooling system of claim 12, wherein the second end of the internal pipe extends across a full width of the opposing second end of the housing, and includes a plurality of apertures configured to emit the cooling liquid.

14. The liquid cooling system of claim 9, wherein the housing includes a fluid collection tray configured to prevent fluid from leaking from the opposing second end of the housing.

15. The liquid cooling system of claim 1, wherein the computing device includes a drain connector configured to fluidly couple the drain manifold to an interior of the housing, the drain connector including a body defining a fluid channel, a ball valve positioned in the fluid channel, and a pinion gear coupled to the ball valve, the pinion gear being rotatable to move the ball valve between a flow position and a sealed position, a portion of the body configured to be inserted into the drain manifold.

16. The liquid cooling system of claim 15, wherein the drain manifold includes a rack gear configured to engage the pinion gear of the drain connector.

17. The liquid cooling system of claim 16, wherein when computing device is moved to the first position, the body of the drain connector moves toward the drain manifold, such that the rack gear rotates the pinion gear to move the ball valve to the sealed position, and cooling liquid is unable to flow from the housing to the drain manifold through the fluid channel of the drain connector.

18. The liquid cooling system of claim 17, wherein when the computing device is moved from the first position to the second position, the body of the drain connector moves away from the drain manifold, such that rack gear rotates the pinion gear to move the ball valve to the flow position, and the cooling liquid is able to flow from the housing to the drain manifold through the fluid channel of the drain connector.

19. The liquid cooling system of claim 1, wherein the computing device includes a control mechanism positioned inside the housing, the control mechanism being configured to control a level of cooling liquid within the housing.

20. A computing device configured to be installed in a rack and fluidly coupled to an input manifold, an output manifold, and a drain manifold, the computing device comprising:
a housing;
one or more electronic components disposed in the housing;
an input connector positioned at a first end of the housing;
an output connector positioned at the first end of the housing; and
a drain connector positioned at the first end of the housing;
wherein when the computing device is in a first position relative to the rack, the input manifold and the output manifold are configured to be fluidly coupled to the housing and the drain manifold is configured to be disconnected from the housing, and
wherein when the computing device is in a second position relative to the rack, the input manifold and the output manifold are disconnected from the housing and the drain manifold is fluidly coupled to the housing.

* * * * *